(12) United States Patent
Kern (10) Patent No.: US 10,545,178 B2
(45) Date of Patent: Jan. 28, 2020

(54) CURRENT SENSOR FOR MEASURING AN ALTERNATING CURRENT

(71) Applicant: SOCOMEC, Benfeld (FR)

(72) Inventor: Christian Kern, Sigolsheim (FR)

(73) Assignee: SOCOMEC, Benfeld (FR)

( * ) Notice: Subject to any disclaimer, the term of this patent is extended or adjusted under 35 U.S.C. 154(b) by 214 days.

(21) Appl. No.: 15/554,260

(22) PCT Filed: Mar. 9, 2016

(86) PCT No.: PCT/EP2016/055060
§ 371 (c)(1),
(2) Date: Aug. 29, 2017

(87) PCT Pub. No.: WO2016/142439
PCT Pub. Date: Sep. 15, 2016

(65) Prior Publication Data
US 2018/0052191 A1 Feb. 22, 2018

(30) Foreign Application Priority Data
Mar. 10, 2015 (FR) ...................................... 15 51984

(51) Int. Cl.
*G01R 15/18* (2006.01)
(52) U.S. Cl.
CPC .................................. *G01R 15/181* (2013.01)
(58) Field of Classification Search
CPC .................................................... G01R 15/181
See application file for complete search history.

(56) References Cited

U.S. PATENT DOCUMENTS 6,313,623 B1 * 11/2001 Kojovic ............... G01R 15/181
324/127
6,348,800 B1 * 2/2002 Haensgen ............ G01R 31/024
324/117 H (Continued)

FOREIGN PATENT DOCUMENTS

DE   10 2007 046 054 A1   4/2008
EP      1 923 709 A1       5/2008

(Continued)

OTHER PUBLICATIONS

International Search Report Corresponding to PCT/EP2016/055060 dated Jun. 8, 2016.

(Continued)

*Primary Examiner* — Daniel R Miller
(74) *Attorney, Agent, or Firm* — Davis & Bujold PLLC; Michael J. Bujold (57) ABSTRACT

A current sensor provided with an electrical coil (5) made in the form of a printed circuit. Its closed contour is inscribed within a rectangle delimiting a through window (9) for passing a primary conductor (2). It comprises four rectilinear segments (TR) connected two by two by a circular sector (SC), delimited by an interior arc (10) and an exterior arc (11). It comprises, in its circular sectors (SC), additional turns (13), which extend from exterior arc (11) towards an intermediate arc (14) located between interior arc (10) and exterior arc (11). They are inserted between the main turns (12) in such a way that the spacing between two consecutive turns (12, 13) on the exterior arc (11) is equal to spacing (P) of the main turns (12) in rectilinear segments (TR) and that the average turns density is almost constant in electrical coil (5).

17 Claims, 5 Drawing Sheets

(56) References Cited

U.S. PATENT DOCUMENTS

| | | |
|---|---|---|
| 7,106,162 B2 | 9/2006 | Saito |
| 7,579,824 B2 | 8/2009 | Rea et al. |
| 2006/0220774 A1* | 10/2006 | Skendzic ............ G01R 15/181 |
| | | 336/200 |
| 2008/0106253 A1 | 5/2008 | Kojovic |
| 2011/0089933 A1* | 4/2011 | Javora ................ G01R 15/142 |
| | | 324/127 |
| 2014/0167786 A1 | 6/2014 | Gutierrez et al. |
| 2015/0015244 A1* | 1/2015 | Ray ..................... G01R 15/181 |
| | | 324/127 |
| 2017/0097379 A1 | 4/2017 | Kern et al. |
| 2017/0138986 A1 | 5/2017 | Kern |

FOREIGN PATENT DOCUMENTS

| | | |
|---|---|---|
| FR | 2 845 197 A1 | 4/2004 |
| WO | 2013/037986 A1 | 3/2013 |
| WO | 2015/150670 A1 | 10/2015 |
| WO | 2015/150671 A1 | 10/2015 |

OTHER PUBLICATIONS

Written Opinion Corresponding to PCT/EP2016/055060 dated Jun. 8, 2016.
International Preliminary Report on Patentability Corresponding to PCT/EP2016/055060 dated Jun. 30, 2017.

* cited by examiner

CURRENT SENSOR FOR MEASURING AN ALTERNATING CURRENT

TECHNICAL SCOPE

The present invention relates to a current sensor for measuring an alternating current, said sensor comprising at least one electrical coil made in the form of a printed circuit provided on at least one electronic board, an electronic unit for conditioning the signal of said electrical coil and an electrical terminal block, said electrical coil having a closed contour inscribed within a polygon and delimiting in its center a through window for an electrical conductor crossed by the alternating current to be measured, this conductor being called primary conductor, said electrical coil comprising N rectilinear segments of width L and N circular sectors of the same width L delimited each by an interior arc of interior radius Ri and an exterior arc of exterior radius Re, said rectilinear segments being connected two by two by a circular sector, said rectilinear segments being made of turns separated from each other by a constant spacing P, and said circular sectors being made of turns separated from each other on said interior arc by a constant spacing equal to spacing P and on said exterior arc by a constant spacing larger than spacing P.

PRIOR ART

Alternating currents are measured by means of current sensors based on various operating principles. A well known and widely used technology for industrial applications is based on the Rogowski principle. This principle consists of a winding in the air placed around an electrical conductor crossed by the alternating current to be measured, commonly called a primary conductor. This winding can be made of one or several serially connected electrical coils. The advantages of this type of current sensor lie in its high linearity and in extended measuring dynamics, which allow measuring currents ranging from a few hundred milliamperes to some thousands of amperes, at frequencies starting from a few tens of hertz. These advantages are mainly due to the absence of a magnetic core to saturate. However, the industrial manufacture of good quality Rogowski coils by means of the classical winding techniques is very complex, expensive and difficult to reproduce, as these coils require a constant turns density per unit length and a constant turn cross-section. Several embodiment examples are illustrated in publication WO 2013/037986.

The solution consists in realizing the Rogowski coils in the form of a printed circuit. This technology allows achieving a high accuracy of the path of the winding and an industrial reproducibility particularly suitable for the compliance with the regularity of the winding. However, the Rogowski coils obtained with this printed circuit technology have a low measuring sensitivity, for example in the order of 10 µV/A for a current to measure with a frequency of 50 Hz, as turns density is low, of the order of 1 to 1.2 turns per mm for the classical printed circuit technologies, and as the turns cannot be superimposed.

Rogowski coils are most often circular, as those described for example in publications FR 2 845 197, DE 10 2007 046 054 and US 2008/0106253. The use of polygonal coils, as those described for example in publications EP 1 923 709 and US 2014/0167786, presents winding regularity problems in the corners and affects coil quality.

The sensitivity of the current sensor then varies according to the relative position of the primary conductor in the through window delimited by the current sensor. The winding irregularities in the corners of the coil also entail lower immunity against external magnetic fields, in particular those who might be generated by a neighboring primary conductor positioned close to the coil, which is always the case in the targeted industrial installations. In fact, there are generally three close phase conductors separated by a distance that is generally in the same order of size as the dimensions of the conductors. For example, if the primary conductors are made of 63 mm wide bars separated by an axis distance of 85 mm, the free space between two consecutive bars is equal to 22 mm. Furthermore, in case of high currents, several rectangular bars parallel to each other are commonly used for each phase. Thus the passage cross-section for every phase has necessarily a rectangular shape. Therefore, the use of circular coils leads to a size of the current sensor that is much larger than with rectangular coils, sometimes to such an extent that the installation of the current sensor becomes impossible because of the proximity of the primary conductors of the other phases.

Publication WO 2013/037986 suggests to add additional tuns in the circular sectors of its polygonal coils to correct partly the defects introduced by the presence of corners in these polygonal coils. But this solution is not optimal in terms of sensitivity. In fact, this publication suggests to split each circular sector of the coil in at least two theoretical adjacent bands by adding additional turns with a width lower than the total width of the coil, to create in each of the theoretical bands an average turns density substantially equal to that of the corresponding rectilinear segment. Due to this construction mode of the coil, the spacing between two consecutive turns is not equal on the interior arc and on the exterior arc of the coil, for a same average turns density, this spacing is reduced on the interior arc of the interior theoretical band of a circular sector while it is larger in the corresponding rectilinear segment, which generates an average turns density in the rectilinear segments that is necessarily lower than the average turns density in an area close to the interior edge of the circular sectors. Now the sensitivity of such a sensor is mainly determined by the turns density in its rectilinear segments, which in this case is insufficient, having a negative impact on measurement accuracy.

Therefore these existing solutions are not satisfactory.

DESCRIPTION OF THE INVENTION

The present invention aims to overcome this problem by offering a new design of the Rogowski-type coils for a current sensor, these coils being made in the form of a printed circuit, having a substantially polygonal shape, whose measuring sensitivity is maximized while ensuring good immunity against the position variations of the primary conductor with respect to the current sensor, and a good immunity against the currents flowing through the neighboring primary conductors, comparable to those of circular coils with a similar technology, and offering a reduced size that allows installing the current sensors on primary conductors very close to each other, as well as ease of integration in any measuring appliance configuration.

To that purpose, the invention relates to a current sensor of the kind described in the preamble, characterized in that said electrical coil moreover comprises in its circular sectors additional turns with a width lower than the width of the other turns, called main turns, and extending from said exterior arc towards at least one intermediate arc located between said interior arc and said exterior arc, said additional turns being inserted between said main turns so that the spacing between two consecutive turns on said exterior arc is substantially equal to spacing P and that the average turns density is almost constant in said electrical coil.

So, the regularity of spacing P between turns, on the interior periphery as well as on the exterior periphery of the electrical coil, and the regularity of the average turns density in the whole width of the electrical coil, as well in the rectilinear segments as in the circular sectors, allow both maximizing the measuring sensitivity of the measuring sensor and minimizing the sensitivity of the measuring sensor to the position of the primary conductor and to the presence of neighboring conductors.

In a first embodiment variant, the electrical coil can comprise, in its circular sectors, first additional turns with a width extending from said exterior arc towards respectively a first intermediate arc located between said interior arc and said exterior arc.

In a second embodiment variant, the electrical coil can comprise, in its circular sectors, first additional turns and second additional turns with different respective widths extending from said exterior arc towards respectively a first intermediate arc and a second intermediate arc located between said interior arc and said exterior arc.

In a preferred embodiment of the invention, the electrical coil is made in the form of a printed circuit comprising at least a first conductive layer and a second conductive layer, superimposed on each other, separated from each other by an insulating core of a substrate of said electronic board, said first and second conductive layers being connected to each other by means of connecting holes passing through said substrate to form the turns of said electrical coil.

The current sensor can comprise a return conductor having a flat surface substantially equal to that of said electrical coil to cancel interference fields, said return conductor being made in the form of a printed circuit comprising at least a third conductive layer, superimposed on said electrical coil and separated from it by an insulating layer of said substrate, said return conductor being serially connected to said electrical coil by means of connecting holes passing through said substrate.

In the preferred embodiment, the current sensor comprises two electrical coils made in the form of a printed circuit comprising at least four conductive layers, said electrical coils being identical, opposite to and superimposed on each other, separated from each other by a central insulating layer of the substrate, and serially connected by means of connecting holes passing through said substrate.

This current sensor according to the invention can advantageously comprise an electrical shield including at least one upper exterior conductive layer and one lower exterior conductive layer covering said electrical coil and its return conductor, or said electrical coils, and separated from the electrical coil(s) and/or from the return conductor by means of an additional insulating layer of said substrate.

The electrical shield can moreover comprise at least one lateral conductive layer covering the edge of said substrate and a conductive housing arranged around said electronic conditioning unit.

In another embodiment, the current sensor according to the invention can comprise a voltage measuring circuit arranged for measuring the voltage applied to the primary conductor. This voltage measuring circuit can comprise at least one detection electrode surrounding the through window provided in said electrical coil, said detection electrode being connected to a reference potential by a RC circuit and being made of at least one lateral conductive layer covering the edge of the substrate surrounding said through window.

Depending on the considered application, the current sensor can be single-phase and comprise a through window for a primary conductor, said through window being surrounded by at least one electrical coil, or be polyphase and comprise N through windows for N primary conductors, each through window being surrounded by at least one electrical coil.

The current sensor can comprise only one single electronic board provided with N through windows, the corresponding electrical coils being arranged on said electronic board. It can also comprise at least two superimposed electronic boards, comprising each N through windows, said corresponding electrical coils being distributed alternately on said electronic boards.

In this case, the electronic conditioning unit associated to every electrical coil can advantageously be arranged between the two electronic boards, forming intrinsically an electrical shield protecting the electronic conditioning units, which allows doing without the conductive housing forming the shield, which is indispensable in a current sensor comprising one single electronic board.

BRIEF DESCRIPTION OF THE DRAWINGS

The present invention and its advantages will be better revealed in the following description of several embodiments given as non limiting examples, in reference to the drawings in appendix, in which.

ILLUSTRATIONS OF THE INVENTION AND VARIOUS WAYS OF REALIZING IT

Figure 1:
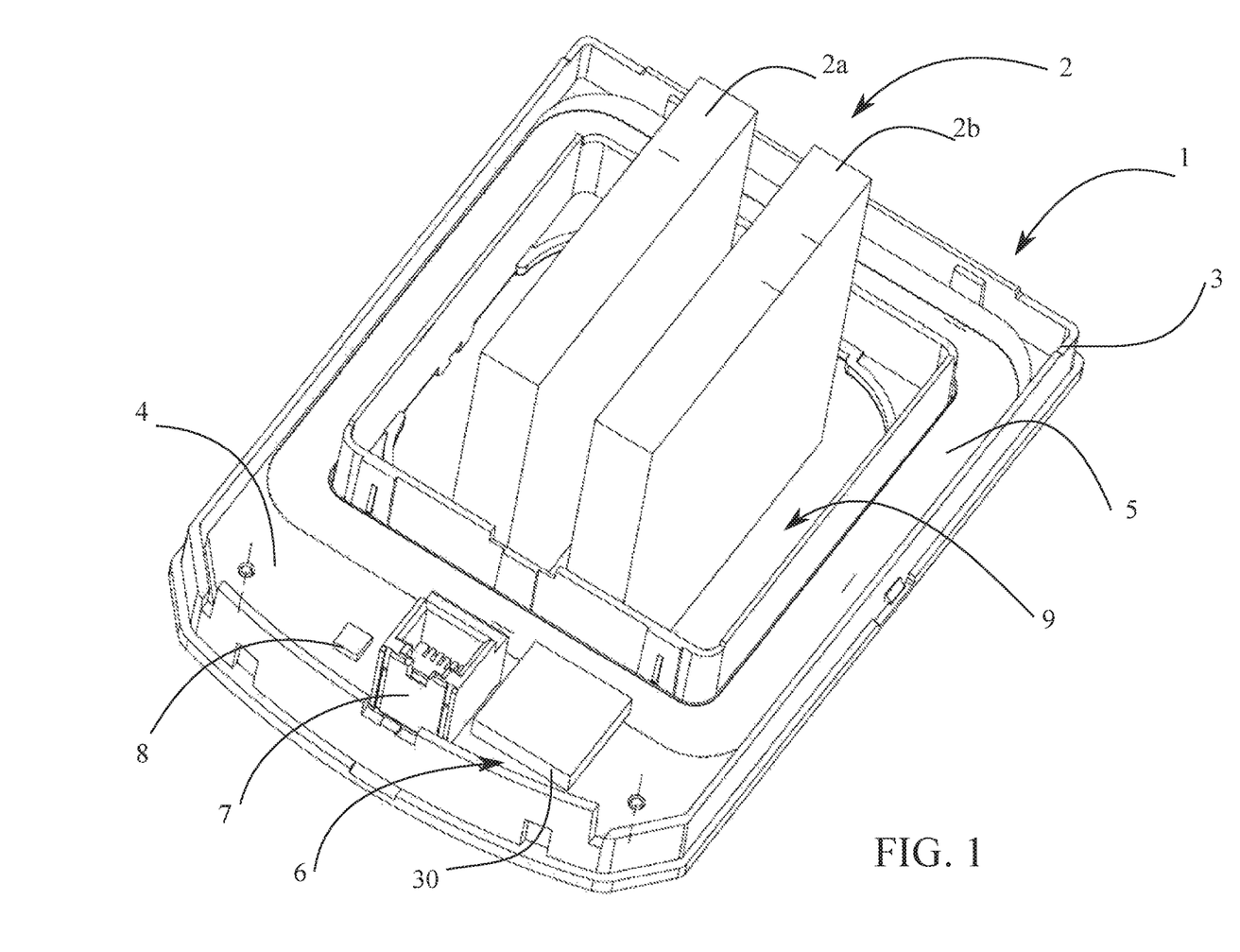
FIG. 1 is a perspective view of a single-phase current sensor according to the invention arranged around a primary conductor.

Referring to FIG. 1, current sensor 1 is a single-phase sensor intended for measuring an alternating current flowing through an electrical conductor. This electrical conductor corresponds to a phase of an electrical installation and is commonly called a primary conductor. In the represented example, primary conductor 2 is made of two conductive bars 2a, 2b having each the shape of a rectangle parallelepiped, and being parallel to each other. This example is not limiting. Primary conductor 2 can be made of one single conductive bar with a square or rectangular cross-section, of more than two parallel conductive bars, of a conductive cable or of a harness of conductive cables with a circular cross-section, or of any other type of a known conductor, whatever its cross-section. The composition and cross-section of the primary conductor are determined by the alternating current it must transport.

This current sensor 1 comprises a housing 3 of which only the lower section is represented to show the inside of current sensor 1. This housing 3 contains an electronic board 4 carrying at least one electrical coil 5 made in the form of a printed circuit, an electronic unit 6 conditioning the signal of electrical coil 5, commonly called an integrator, and an electrical terminal block 7 for connecting current sensor 1 to peripheral equipment, such as for example a supervision station for the parameters of the electrical installation. Current sensor 1 can be integral part of a measuring device or be independent and mounted directly on primary conductor 2. Application examples are for example described in publications WO 2015/150670 A1 and WO 2015/150671 A1 of the same applicant.

In the represented example, electronic board 4 moreover comprises a memory unit 8 in which the calibration data of current sensor 1 is stored. The composition of current sensor 1 as described and illustrated can of course vary depending on the needs, on the configuration of the electrical installation to be monitored and on the measuring and/or supervision devices. Units 6 and 8 and terminal 7 are integrated in electronic board 4, which carries electrical coil 5, but they can be separated and connected to electrical coil 5 by means of any suitable connection system.

In the illustrated example, electrical coil 5 has a closed contour inscribed within a polygon, which here is rectangular. This substantially polygonal contour with rounded corners has the advantage of being smaller than a circular contour, especially when primary conductor 2 is polygonal. Electrical coil 5 delimits in its center a through window 9, having also a substantially polygonal contour, crossed by primary conductor 2 positioned preferably in the central section of through window 9 and perpendicularly to the plane of electrical coil 5. However, the constructive features of electrical coil 5, which will be described later, allow rendering current sensor 1 insensitive to the relative position of primary conductor 2 with respect to electrical coil 5, and to the proximity of the neighboring primary conductors, as well as to the induced interference fields if primary conductor 2 is not perpendicular to the plane of electrical coil 5.

Figure 2:
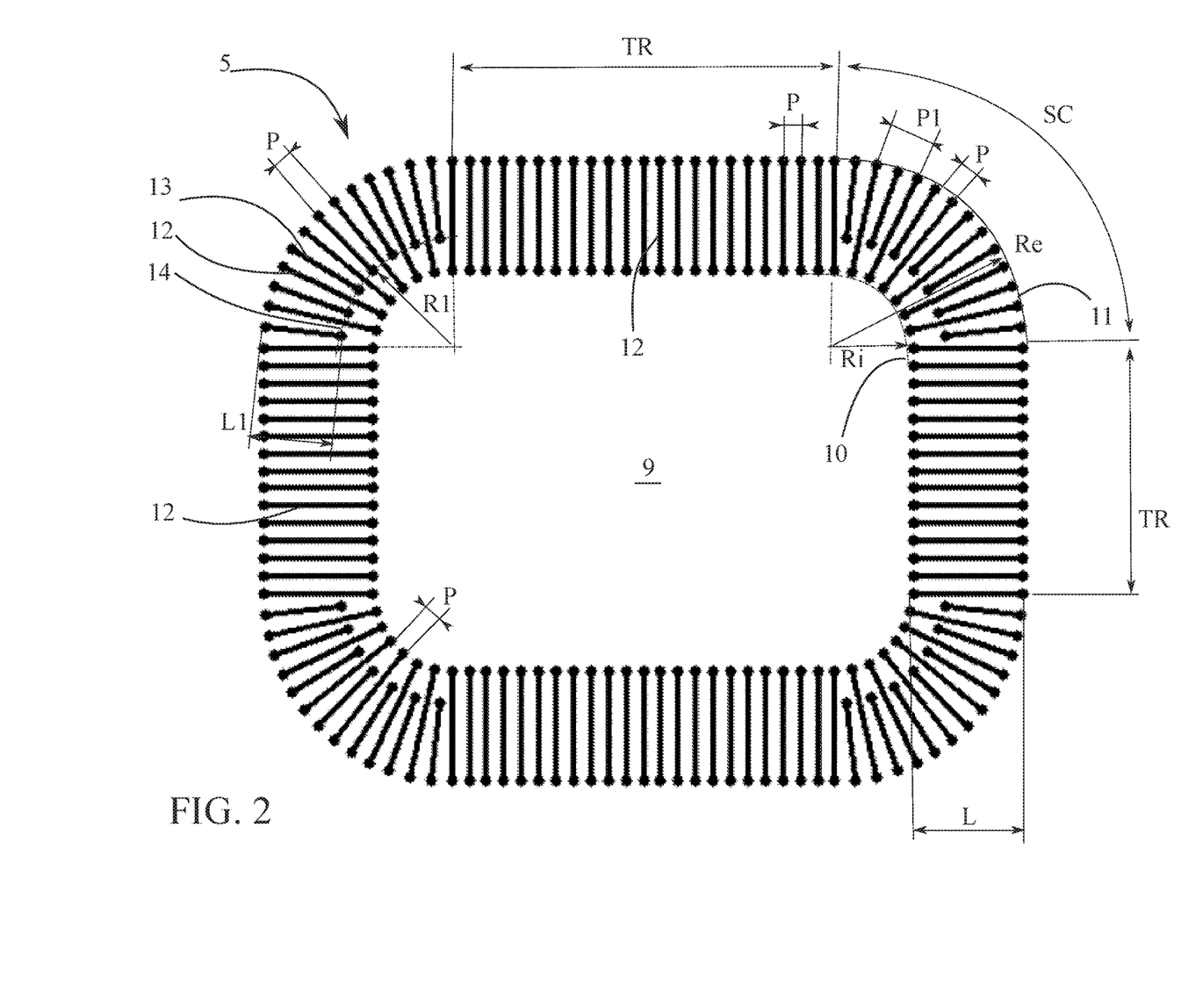
FIG. 2 is a top view of an electrical coil belonging to the current sensor of FIG. 1.

Referring more specifically to FIG. 2, electrical coil 5 comprises N rectilinear segments TR of width L and N circular sectors SC of the same width L, the rectilinear segments TR being connected two by two by a circular sector SC. In the figures, the number N of rectilinear segments TR and of circular sectors SC is equal to four since the polygon within which electrical coil 5 is inscribed is a rectangle.

This example is not limiting and number N of rectilinear segments TR and of circular sectors SC can be higher or lower than four. Each circular sector SC is delimited by an interior arc 10 of interior radius Ri and an exterior arc 11 of exterior radius Re where Re=Ri+L. The rectilinear segments TR are made of turns 12 regularly separated by a constant spacing P, and the circular sectors SC are made of turns 12 separated on interior arc 10 by a constant spacing equal to spacing P and on exterior arc 11 by a constant spacing P1 larger than spacing P. In fact, they are separated from each other by an angle depending on spacing P and on interior radius Ri. In FIG. 2, spacing P1 is substantially equal to 2P.

The fact of maintaining a constant spacing P between two consecutive turns 12 on the interior edge of electrical coil 5, as well in its rectilinear segments TR as in its circular sectors SC, allows ensuring a constant turns density in the area close to this interior edge, which provides an undeniable advantage from the point of view of the immunity of the measurement against the position variations of primary conductor 2 with respect to electrical coil 5. In fact, when a primary conductor 2 comes closer to circular sectors SC of electrical coil 5, in which the turns density cannot be constant on the whole width of the coil, it is particularly important to maintain this turns density constant in the area close to the interior edge, where the magnetic field gradients are the strongest, since this is the area where the bad approximations of Ampere's integral will have the most influence.

Figures 3, 4:
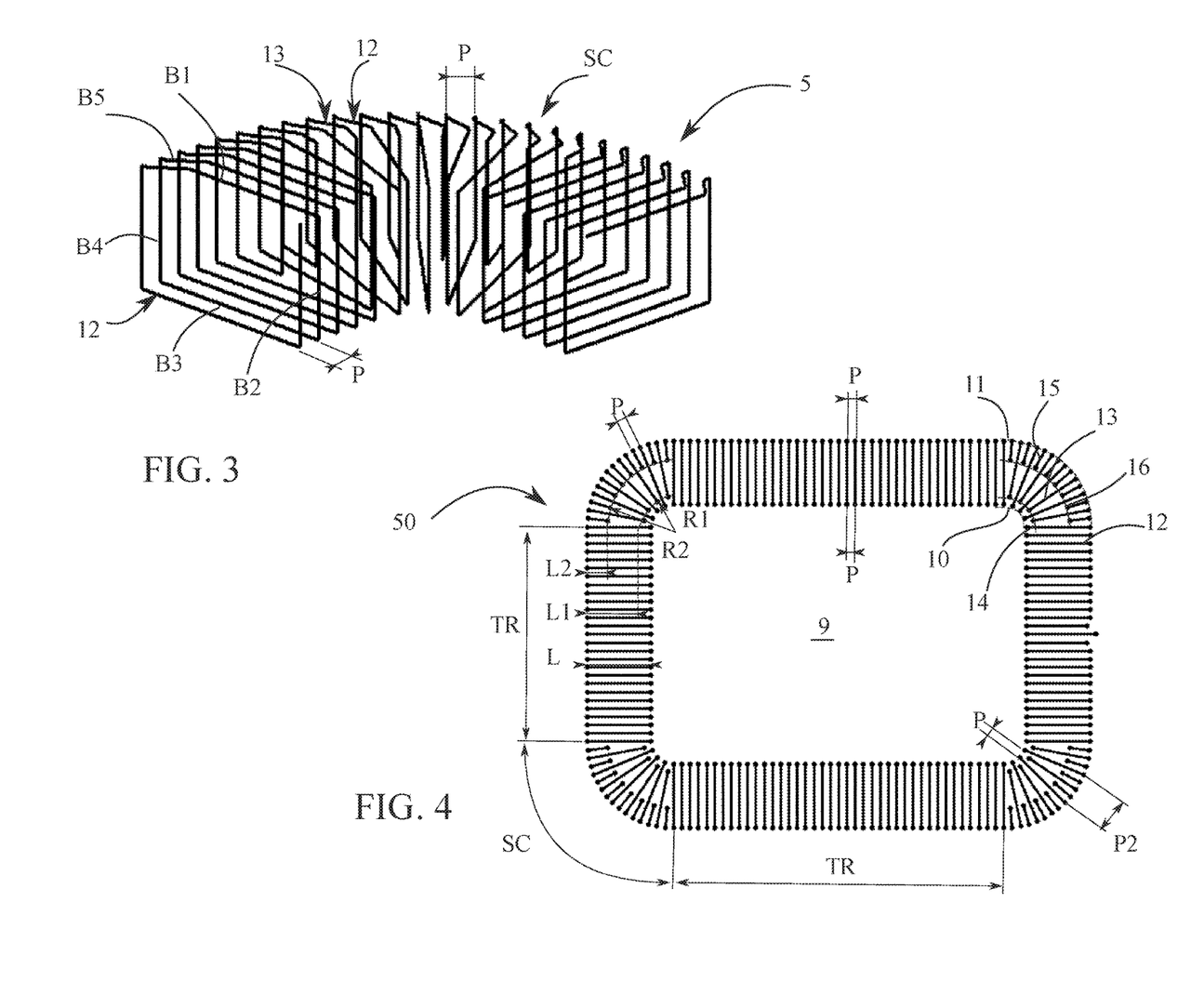
FIG. 3 is a perspective view of a circular sector of the winding corresponding to the electrical coil of FIG. 2.
FIG. 4 is a top view of an embodiment variant of the electrical coil of FIG. 2.

In the example of FIG. 2, electrical coil 5 comprises, in its circular sectors SC, first additional turns 13 of width L1 smaller than width L of the other turns 12 called main turns 12. These first additional turns 13 extend from exterior arc 11 towards a first intermediate arc 14 of radius R1 located between interior arc 10 and exterior arc 11. They are inserted between main turns 12 so that an additional turn 13 is positioned between two main turns 12, reducing the spacing between two consecutive turns 12, 13 on exterior arc 11 to a value substantially equal to spacing P. So, the average density of turns 12, 13 in circular sectors SC is substantially equal to the density of turns 12 in rectilinear segments TR. The average turns density is the average value, taken on whole width L of electrical coil 5, of the number of turns per length unit. The fact of reducing the spacing between two consecutive turns 12, 13 on exterior arc 11 to a value substantially equal to spacing P between two consecutive turns 12 on interior arc 10 provides an undeniable advantage from the point of view of the immunity of the measurement against the presence of external primary conductors neighboring electrical coil 5 for the same reasons as described previously. So, the regularity of the winding obtained by the invention allows minimizing the sensitivity variation of current sensor 1 according to the relative position of primary conductor 2, and increasing its immunity against external and neighboring primary conductors. FIG. 4 illustrates another electrical coil 50 of current sensor 1 which is an embodiment variant of electrical coil 5 of FIG. 2. The identical parts have the same alphanumerical references. As circular sectors SC are defined by an interior arc 10 and an exterior arc 11 with radii Ri and Re smaller than those of electrical coil 5 of FIG. 2, spacing P2 of main turns 12 on exterior arc 11 is larger then spacing P1 and substantially equal to 4P. In this embodiment variant, electrical coil 50 comprises in its circular sectors SC, first additional turns 13 of width L1 and second additional turns 15 of width L2, the two widths L1 and L2 being different and smaller than width L of main turns 12. First additional turns 13 extend from exterior arc 11 towards a first intermediate arc 14 and second intermediate turns 15 extend from exterior arc 11 towards a second intermediate arc 16, the two intermediate arcs 14, 16 being located between interior arc 10 and exterior arc 11. The first and second additional turns 13, 15 are inserted between main turns 12 so that a first additional turn 13 surrounded by two second additional turns 15 are positioned between two main turns 12, reducing the spacing between two consecutive turns 12, 13, 15 on exterior arc 11 to a value substantially equal to spacing P.

The two embodiment examples of electrical coils 5 and 50 according to FIGS. 2 and 4 are not limiting and the number of additional turns, as well as their width L1, L2 and/or the number of intermediate arcs 14, 16 in circular sectors SC of said electrical coils are not restrictive. The more intermediate arcs are added in circular sectors SC, the more the freedom of arrangement of the additional turns is large to achieve a constant average turns density.

In a general way, the different widths L, L1, L2 of turns 12, 13, 15 are determined in order to minimize the sensitivity of current sensor 1 to the position of primary conductor 2 and to interference signals produced by a neighboring external conductor. The exact determination of the different widths L, L1, L2 is obtained by calculating the response of electrical coil 5, 50 according to the position of a primary conductor 2 placed in all expected positions, and to the response of said coil to a neighboring external conductor placed in contact with current sensor 1 in all expected positions and minimizing both the sensitivity gap with respect to a reference position of primary conductor 2 and with respect to an external conductor. In the case of electrical coils 5, 50 located in the air with a rectangular cross-section and for a circular primary conductor 2, the calculation of the response of electrical coil 5, 50 can be performed analytically and very accurately, which makes possible the use of optimization algorithms for the search for the best choice for the different widths of turns L, L1, L2. In a general way, the optimum thus obtained is close to a configuration in which the average turns density taken on the whole width of electrical coil 5, 50 in circular sectors SC is identical to the turns density in rectilinear segments TR.

The electrical coils 5 and 50 as represented in FIGS. 2 and 4 comprising additional turns 13, 15 of variable width L1, L2 in circular sectors SC can only be realized in the form of a printed circuit and can in no case be realized with the classic winding technologies. As a non limiting example, for electrical coils 5, 50 using this configuration with additional turns 13, 15, the optimal values for widths L1 and L2 are close to L1=0.113×L et L2=0.31×L in these examples.

Figure 5:
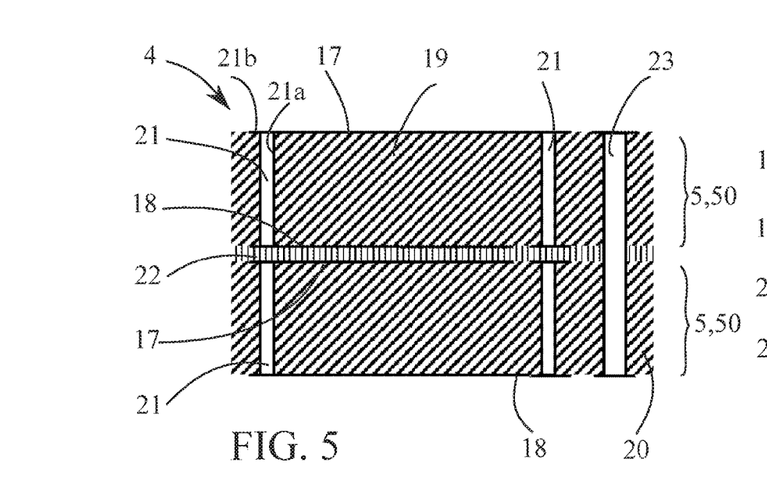
FIG. 5 is an enlarged cross-section of a printed circuit substrate of the current sensor of FIG. 1.
Figure 6:
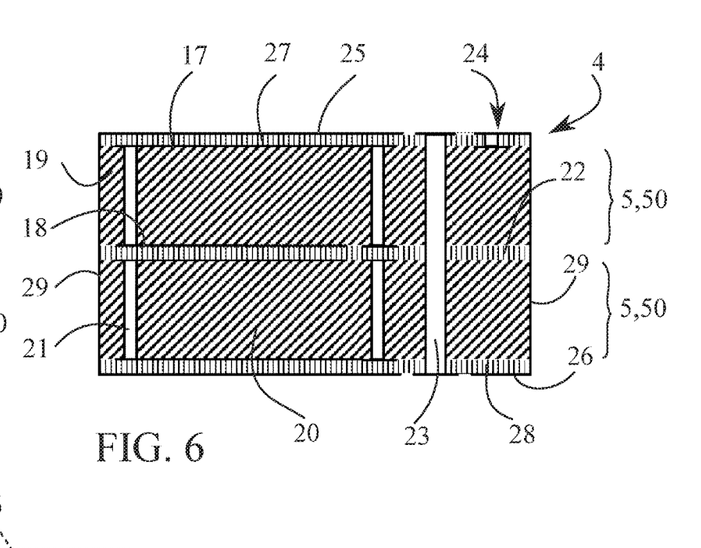
FIG. 6 is an enlarged cross-section of an embodiment variant of the substrate of FIG. 5.

FIGS. 5 and 6 illustrate an embodiment of current sensor 1 comprising two identical and superimposed electrical coils 5, 50, as explained later. These figures are used to describe the manufacture of one of electrical coils 5, 50, which comprises two conductive layers 17, 18, called first conductive layer 17 and second conductive layer 18, superimposed and separated from each other by a thick insulating core 19 made of a substrate 20, which is integral part of electronic board 4. Substrate 20 forms a support for conductive layers 17, 18. It is therefore made of an insulating material such as, for example, an epoxy resin, a polyimid resin or teflon-based materials. The first and second conductive layers 17, 18, which are commonly made out of copper, are connected with each other by first connection holes 21 passing through insulating core 19 to form turns 12, 13, 15 of electrical coil 5, 50, these connecting holes 21 being conductive. To that purpose, connecting holes 21 are covered inside with a conductive sleeve 21a and surrounded outside with a conductive crown 21b, in particular out of copper.

The forming of turns 12, 13, 15 is illustrated more in detail in FIG. 3, which shows an example of the winding of electrical coil 5 in one of its circular sectors SC without representing substrate 20 of electronic board 4 to facilitate the understanding of the drawing. Each turn 12, 13, which corresponds to a turn of the winding, comprises a first rectilinear section B1 provided in one of conductive layers 17, 18, a first return loop B2 passing through substrate 20 with a first connection hole 21 perpendicular to substrate 20, a second rectilinear section B3 provided in the other of conductive layers 17, 18, substantially parallel to first rectilinear section B1, and a second return loop B4 passing through substrate 20 with another first connection hole 21 perpendicular to substrate 20, then an end section B5 inclined with respect to first rectilinear section B1 of the following turn 12, 13 separated by a spacing P from the previous turn 12, 13. Of course, any other embodiment of the winding of electrical coil 5 can be suitable. The advantages of such an embodiment in the form of a printed circuit are, as seen previously, the regularity of the turns 12, 13, 15 obtained, the possibility of adding additional turns 13, 15 with different widths, the serial reproducibility of said winding, the optimization of this winding and the immunity of electrical coil 5, 50 obtained against the variation of the position of primary conductor 2 and against the parasitic currents generated by the neighboring conductors. It is thus possible to choose the smallest spacing P possible for a given printed circuit technology in circular sectors SC, which is implemented in rectilinear segments TR in order to maximize the measuring sensitivity of current sensor 1, 1' obtained. As a non-limiting example, for conductive tracks with a width of 150 m forming turns 12 and additional turns 13, 15, and connection holes 21 with a minimum diameter of 0.4 mm provided with a conductive crown 21b arranged around connection holes 21 with a minimum width of 175 µm, minimum spacing P is equal to 0.9 mm.

As in all Rogowski coils, if one simply taps the output voltage directly between the input of the first turn and the output of the last turn of electrical coil 5, 50, current sensor 1 will operate correctly only for primary conductors 2 orthogonal to the plane of the coil. Any other configuration will create fields orthogonal to electrical coil 5, 50, which will be captured by the whole flat surface of the coil. To solve this problem, one can use a return conductor (not represented) having the same flat surface as electrical coil 5, 50 to cancel this response by differential effect. In a simplified embodiment variant (not represented), one can use a return conductor having exactly the path of the projection of electrical coil 5, 50 on the plane of the printed circuit. Such configuration can be obtained with a printed circuit with three conductive layers, the return conductor being realized on a third conductive layer. But, as such configuration is relatively rare, one will rather realize it in four conductive layers. In this case, thick insulating core 19 of substrate 20 carries the first and second conductive layers 17, 18 of electrical coil 5, 50 and the third and fourth external conductive layers form the return conductor. These third and fourth external conductive layers are separated from electrical coil 5, 50 respectively by a thin insulating layer of substrate 20. This return conductor is then connected serially to electrical coil 5, 50 by connection holes passing through the insulating core and the insulating layers. The terms "thick" and "thin" are relative, but they allow identifying insulating core 19, which carries electrical coil 5, 50 of current sensor 1 and is usually thicker than the other thinner insulating layers used for other purposes. The thickness of the insulants in electrical coils 5, 50 is chosen according to the required sensitivity. The thicker the insulant, the better the signal obtained. On the other hand, the thickness of the insulants between the electrical coils or between the electrical coils and the electrical shield is chosen as small as possible to limit the global dimensions of current sensor 1, 1'.

However, this simple return conductor is fully efficient only for homogeneous interference fields. The immunity against orthogonal interference fields can be improved by coupling two identical electrical coils 5, 50 in opposition, that is to say whose winding is wound in opposite directions. In this case, the useful fields add and, since the two coils have the same sensitivity to the orthogonal fields and are coupled in opposition, these interference fields are eliminated almost perfectly. Such configuration is advantageously obtained by means of a printed circuit with four conductive layers 17, 18 according to FIG. 5. Each electrical coil 5, 50 is realized by a first conductive layer 17 and a second conductive layer 18 located on either side of a thick insulating core 19 crossed by first connection holes 21. The two electrical coils 5, 50 are superimposed and separated from each other by a thin central insulating layer 22 and they are connected serially by second connecting holes 23 passing through insulating core 19 and insulating central layer 22.

As in all Rogowski coils, electrical coil 5, 50 is also sensitive to interferences due to capacitive coupling between live primary conductor 2 carrying the alternating current to be measured and electrical coil 5, 50. To eliminate this effect, current sensor 1 is provided with an electrical shield 24. Referring more specifically to FIG. 6, this electrical shield 24 can consist in an upper external conductive layer 25 and a lower external conductive layer 26 covering electrical coil(s) 5, 50, and/or the return conductor, and separated from electrical coil(s) 5, 50, and/or from electrical return conductor respectively by an additional thin insulating layer 27, 28 of substrate 20. This electrical shield can be complemented with at least one lateral conductive layer 29 covering the edges of substrate 20. Electrical coil 5, 50 is then entirely enclosed in a Faraday cage and is therefore totally protected against capacitive couplings.

Figure 8:
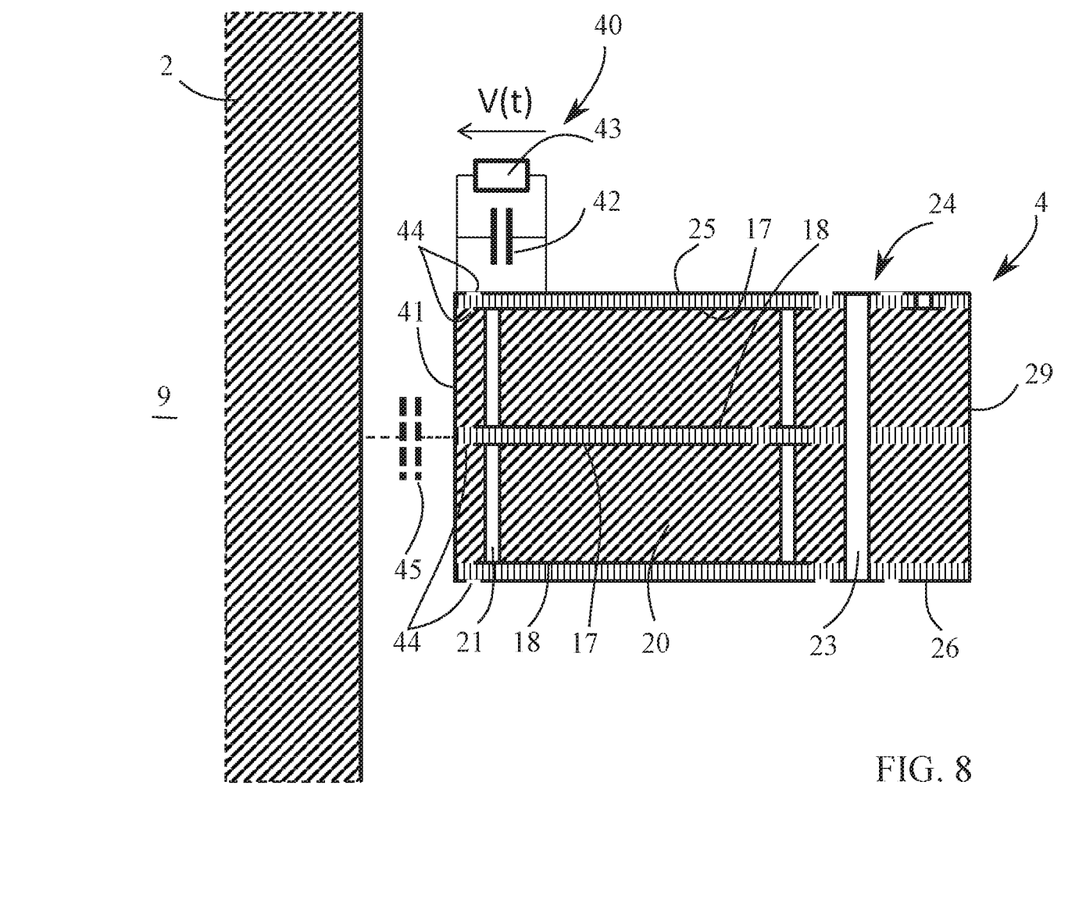
FIG. 8 is a view similar to FIG. 6 of another embodiment variant of the printed circuit of the current sensor of FIG. 1, adding a voltage measurement function.

FIG. 8 illustrates another embodiment of substrate 20 of FIG. 6 that allows complementing current sensor 1, 1' of the invention with a voltage measuring circuit 40 arranged for measuring the voltage V(t) applied to primary conductor 2. In this embodiment, lateral conductive layer 29 of substrate 20 of FIG. 6, which surrounds through window 9 provided in electrical coil 5, 50 for primary conductor 2, can form a detection electrode 41 for the voltage applied to said primary conductor 2. This detection electrode 41, instead of being connected to a reference potential as that of the rest of electrical shield 24, is insulated from the rest of electrical shield 24 and connected to a reference potential, which can be the same as that of electrical shield 24 or any other reference potential not necessarily connected to the shield, via a capacitor 42 connected in parallel to a resistor 43. The electrical insulation of detection electrode 41 from the rest of electrical shield 24 is achieved by an interruption zone 44 in the corresponding conductive layers 17, 18, 25, 26 provided on substrate 20, or by any equivalent means performing the same function. Capacitor 42 can have a typical value from some hundred picofarads (pF) to some tens of nanofarads (nF), and resistor 43 can have a typical value comprised between some tens of kilo-ohms (kΩ) to some mega-ohms (MΩ). Detection electrode 41 and primary conductor 2 thus form a capacitance illustrated by a capacitor 45 represented by dotted lines in FIG. 8 and having a value comprised between a fraction of a picofarad and some picofarads (pF). The set formed by detection electrode 41 and the RC assembly (capacitor 42+capacitor 45+resistor 43) forms a high-pass filter with a cut-off frequency that can range from some tenths of a hertz to some hundred of hertz, according to the processing type chose for the output signal. This high-pass filter also forms a voltage divider that generates an output voltage V(t) at the terminals of resistor 43 that is an image of the voltage applied to said primary conductor 2 and that can be interpreted by a processing unit. Application examples are illustrated in publications WO 2015/150670 A1 and WO 2015/150671 A1 of the same applicant. The values of capacitors 42, 45 and of resistor 43 are only given on an indicative basis and are not limiting.

As this Rogowski coil shows low sensitivity, typically 10 µV/A for a current to measure with a frequency of 50 Hz, electronic conditioning unit 6, which generally includes a 1st-order low-pass amplifier circuit, must be located close to electrical coil 5, 50 to limit the influences of the interfering magnetic fields in the connections between electrical coil 5, 50 and said electronic conditioning unit 6. A consequence of this proximity is the proximity of primary conductor 2, which can generate a capacitive coupling between primary conductor 2 and said electronic conditioning unit 6. It is therefore indispensable to protect this electronic conditioning unit 6 by means of an electrical shield, which can be made in the form of a conductive housing 30 containing said electronic conditioning unit 6.

Figure 7A:
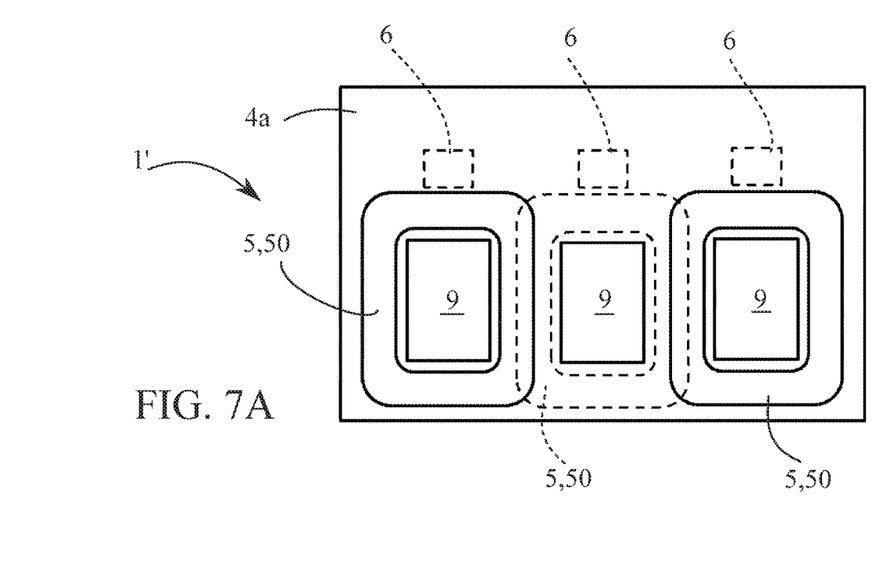
FIGS. 7A and 7B are respectively a front view and a side view of a polyphase current sensor.
Figure 7B:
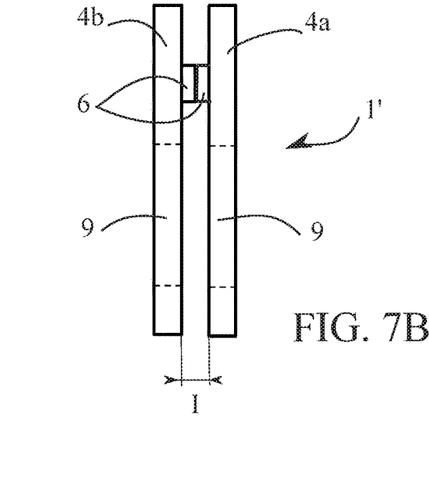

Current sensor 1' can also be a polyphase sensor, that is to say a sensor suitable for measuring the alternating current in an electrical installation comprising more than one phase, and thus more than one primary conductor 2. FIGS. 7A and 7B illustrate an embodiment example of a three-phase current sensor 1'. In function of the axis distance of primary conductors 2 and of the size of electrical coils 5, 50, it can be interesting to provide a current sensor 1' provided with two electronic boards 4a, 4b superimposed, parallel and separated by an interval I wherein electrical coils 5, 50 are arranged in an alternating manner. For example, electrical coil 5, 50 corresponding to the central primary conductor can be mounted on rear electronic board 4b, while the two other electrical coils 5, 50 corresponding to the end electrical conductors can be mounted on front electronic board 4a. This way, the size of electrical coils 5, 50 is no longer a barrier and current sensor 1' can be adapted to all configurations of a device for polyphase measurement and/or for multiphase electrical installations. In this embodiment example, the electronic conditioning units 6 arranged close to their electrical coils 5, 50 will be positioned in interval I existing between the two electronic boards 4a, 4b. This particular circuit has the advantage of forming intrinsically an electrical shield protecting said electronic conditioning units 6, allowing to do without conductive housing 30 necessary in single-phase current sensor 1 illustrated in figure 1and comprising one single electronic board 4.

Other configurations can be considered to realize a polyphase current sensor 1' according to the invention. Electrical coils 5 and corresponding through windows 9 can be arranged on a same electronic board 4. In this case, they can be aligned, staggered or arranged according to any other layout.

Possibilities for Industrial Application:

Current sensor 1, 1' as described can therefore be realized with well-known printed circuit manufacturing techniques that allow realizing Rogowski-type electrical coils with a substantially polygonal shape and optimizing the quality of these coils, ensuring them an immunity against interference fields and currents equivalent to that of circular coils, with the advantages of the polygonal shape in terms of size and ease of implantation. This description shows clearly that the invention allows reaching the goals defined.

The present invention is however not restricted to the examples of embodiment described, but extends to any modification and variant which is obvious to a person skilled in the art.

The invention claimed is:

1. A current sensor (1, 1') for measuring an alternating current, the sensor comprising:
  at least one electrical coil (5, 50),
  an electronic unit (6) for conditioning a signal of the at least one electrical coil,
  an electrical terminal block (7),
  the at least one electrical coil (5, 50) having a closed contour inscribed within a polygon and delimiting in its center a through window (9) for an electrical conductor crossed by the alternating current to be measured, this conductor being called a primary conductor (2), the at least one electrical coil (5, 50) comprising N rectilinear segments (TR) of width L and N circular sectors (SC) delimited each by an interior arc (10) of interior radius Ri and an exterior arc (11) of exterior radius Re, the rectilinear segments (TR) being connected two by two by a circular sector (SC), the rectilinear segments (TR) being made of turns (12) separated from each other by a constant spacing P, separated from each other on the interior arc (10) by a constant spacing equal to spacing P, wherein the at least one electrical coil (5, 50) is made in a form of a printed circuit provided on at least one electronic board (4) comprising additional turns (13, 15) in its circular sectors (SC) with a width (L1, L2) lower than the width (L) of other turns, called main turns (12), and extending from the exterior arc (11) towards at least one intermediate arc (14, 16) located between the interior arc (10) and the exterior arc (11), the additional turns (13, 15) being inserted between the main turns (12) so that the spacing between two consecutive turns (12, 13, 15) on the exterior arc (11) is substantially equal to spacing P, the N rectilinear segments (TR) and the N circular sectors (SC) have a same width L, in the circular sectors (SC), main turns (12) being separated from each other on the interior arc (10) by a constant spacing equal to spacing P, of rectilinear segments (TR), and main turns (12) and additional turns (13, 15) being separated from each other on the exterior arc (11) by rectilinear segments (TR), so that an average turns density is almost constant in all of the electrical coil (5, 50), and the constant spacing P is chosen the smallest spacing P possible for a given printed circuit technology in circuit sectors (SC) which is implemented in rectilinear segments (TR) in order to maximize the measuring sensitivity of the current sensor (1, 11).

2. The current sensor according to claim 1, wherein the electrical coil (5) comprises, in its circular sectors (SC), first additional turns (13) with a width (L1) extending from the exterior arc (11) towards respectively a first intermediate arc (14) located between the interior arc (10) and the exterior arc (11).

3. The current sensor according to claim 1, wherein the electrical coil (50) comprises, in the circular sectors (SC), first additional turns (13) and second additional turns (15) with different respective widths (L1) and (L2) extending from the exterior arc (11) towards respectively a first intermediate arc (14) and a second intermediate arc (16) located between the interior arc (10) and the exterior arc (11).

4. The current sensor according to claim 1, wherein the electrical coil (5, 50) is made in the form of a printed circuit comprising at least a first conductive layer (17) and a second conductive layer (18), superimposed on each other, separated from each other by an insulating core (19) of a substrate (20) of the electronic board (4), and the first and second conductive layers (17, 18) are connected to each other by connecting holes (21) passing through the substrate (20) to form the turns (12, 13, 15) of the electrical coil (5, 50).

5. The current sensor according to claim 4, wherein the current sensor comprises a return conductor having a flat surface substantially equal to that of the electrical coil (5, 50) to cancel interference fields, the return conductor is made in the form of a printed circuit comprising at least a third conductive layer, superimposed on the electrical coil (5, 50) and separated from the electrical coil (5, 50) by an insulating layer of the substrate (20), and the return conductor is serially connected to the electrical coil (5, 50) by connecting holes passing through the substrate (20).

6. The current sensor according to claim 4, wherein the current sensor comprises two electrical coils (5, 50) made in the form of a printed circuit comprising at least four conductive layers (17, 18), the two electrical coils (5, 50) are identical, opposite to and superimposed on each other, separated from each other by a central insulating layer (22) of the substrate (20), and are serially connected by connecting holes (23) passing through the substrate (20).

7. The current sensor according to claim 1, wherein the current sensor comprises an electrical shield (24).

8. The current sensor according to claim 7, wherein the electrical shield (24) includes at least one upper exterior conductive layer (25) and one lower exterior conductive layer (26) covering the electrical coil (5, 50) and a return conductor, or the electrical coils (5, 50), and separated from the electrical coil(s) (5, 50) and/or from the return conductor by an additional insulating layer (27, 28) of a substrate (20).

9. The current sensor according to claim 7, wherein the electrical shield (24) comprises at least one lateral conductive layer (29) covering an edge of the substrate (20).

10. The current sensor according to claim 7, wherein the electrical shield (24) comprises a conductive housing (30) arranged around the electronic conditioning unit (6).

11. The current sensor according to claim 1, wherein the current sensor is a single-phase current sensor and comprises the through window (9) for the primary conductor (2), and the through window (9) is surrounded by the at least one electrical coil (5, 50).

12. The current sensor according to claim 1, wherein the current sensor is a polyphase current sensor and comprises N through windows (9) for N primary conductors (2), and each through window (9) is surrounded by a corresponding one of the at least one electrical coil (5, 50).

13. The current sensor according to claim 12, wherein the current sensor comprises one electronic board (4) provided with N through windows (9), and the corresponding electrical coils (5, 50) are arranged on the electronic board (4).

14. The current sensor according to claim 12, wherein the current sensor comprises at least two superimposed electronic boards (4a, 4b), comprising each N through windows (9), and the corresponding electrical coils (5, 50) are distributed alternately on the electronic boards (4a, 4b).

15. The current sensor according to claim 14, wherein an electronic conditioning unit (6) being associated to each electrical coil (5, 50) is arranged in an interval (I) located between the at least two electronic boards (4), forming intrinsically an electrical shield protecting the electronic conditioning units (6).

16. The current sensor according to claim 1, wherein the current sensor comprises a voltage measuring circuit (40) arranged for measuring a voltage applied to the primary conductor (2).

17. The current sensor according to claim 16, wherein the voltage measuring circuit (40) comprises at least one detection electrode (41) surrounding the through window (9) provided in the electrical coil (5, 50), and the at least one detection electrode (41) is connected to a reference potential by a RC circuit (42, 43, 45) and is made of at least one lateral conductive layer (29) covering an edge of substrate (20) surrounding the through window (9).

* * * * *